(12) United States Patent
Nakamura et al.

(10) Patent No.: US 6,555,416 B2
(45) Date of Patent: Apr. 29, 2003

(54) CHIP SIZE PACKAGE SEMICONDUCTOR DEVICE AND METHOD OF FORMING THE SAME

(75) Inventors: Hirofumi Nakamura, Tokyo (JP); Masamoto Tago, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/023,805

(22) Filed: Dec. 21, 2001

(65) Prior Publication Data

US 2002/0068383 A1 Jun. 6, 2002

Related U.S. Application Data

(62) Division of application No. 09/166,176, filed on Oct. 5, 1998, now Pat. No. 6,344,696.

(30) Foreign Application Priority Data

Oct. 3, 1997 (JP) ................................. 9-271323

(51) Int. Cl.[7] ........................ H01L 21/44; H01L 21/30
(52) U.S. Cl. ...................... 438/108; 438/110; 438/113; 438/458
(58) Field of Search ................................ 438/106, 108, 438/110, 113, 118, 119, 458, 460

(56) References Cited

U.S. PATENT DOCUMENTS

| | | |
|---|---|---|
| 5,023,205 A | 6/1991 | Reche |
| 5,478,781 A | 12/1995 | Bertin et al. |
| 5,852,326 A | 12/1998 | Khandros et al. |
| 5,885,849 A | 3/1999 | DiStefano et al. |
| 5,926,694 A | 7/1999 | Chigawa et al. |
| 5,950,304 A | 9/1999 | Khandros et al. |

FOREIGN PATENT DOCUMENTS

| | | |
|---|---|---|
| JP | 51-137378 | 11/1976 |
| JP | H7-45649 | 2/1995 |
| JP | 8-288293 | 11/1996 |
| JP | 9-51051 | 2/1997 |
| JP | 9-64049 | 3/1997 |
| JP | 9-219421 | 8/1997 |
| JP | 10-79362 | 3/1998 |

Primary Examiner—Kamand Cuneo
Assistant Examiner—Scott B. Geyer
(74) Attorney, Agent, or Firm—Sughrue Mion, PLLC

(57) ABSTRACT

The present invention provides a semiconductor chip having a bonding face to be mounted onto a mother board, wherein a low elastic modulus resin layer is provided in contact directly with the bonding face of the semiconductor chip without intervening any interposer to form a chip size package, and the low elastic modulus resin layer has at least a conductive pattern of a build-up type, and wherein the low elastic modulus resin layer has both a sufficiently low elastic modulus and a sufficiently large thickness for allowing realization of a stress caused due to a difference in thermal expansion coefficient between the semiconductor chip and the mother board.

7 Claims, 10 Drawing Sheets

US 6,555,416 B2

CHIP SIZE PACKAGE SEMICONDUCTOR DEVICE AND METHOD OF FORMING THE SAME

This is a divisional of application Ser. No. 09/166,176, filed Oct. 5, 1998 now U.S. Pat. No. 6,344,696; the disclosure of which is incorporated herein by reference.

BACKGROUND OF THE INVENTION

The present invention relates to a chip size package semiconductor device and a method of forming the same.

The chip size package is a package minimized in size and weight. There have been known various types of the chip size packages. Some kinds of the conventional chip size packages will be described with reference to the accompanying drawings.

FIG. 1 is a cross sectional elevation view illustrative of a first conventional chip size package. A silicon chip 2 is bonded onto a printed wiring board 14 by a flip chip bonding method. The silicon chip 2 has a flip chip bonding surface which has electrode pads on which gold bumps 13 are formed. The printed wiring board 14 also has a flip chip bonding surface which has bonding pads 15. The silicon chip 2 is bonded onto the printed wiring board 14 through the gold bumps 13, whereby a gap or a space is formed between the silicon chip 2 and the printed wiring board 14. The gap or space between the silicon chip 2 and the printed wiring board 14 is sealed with a sealing resin 12. The printed wiring board 14 has an opposite surface to the flip chip bonding surface, wherein the opposite surface has an array of solder balls 20 which has a larger pitch than the electrode pad pitch of the silicon chip 2, so as to enable the printed wiring board 14 to make an electrical connection through the larger-pitched solder balls 20 to a mother board not illustrated, wherein the printed wiring board 14 serves as an interposer. This interposer allows the electrode pitch of the silicon chip to be much more narrowed than the necessary pitch of the solder balls 20 for the required external connection to the mother board.

FIG. 2 is a cross sectional elevation view illustrative of a second conventional chip size package. A silicon chip 2 is bonded onto a carrier tape 18. The silicon chip 2 has a bonding surface which has electrode pads on which gold bumps 13 are formed. The carrier tape 18 also has a bonding surface bonded with the silicon chip 2. The silicon chip 2 is bonded onto the carrier tape 18 through the gold bumps 13 and an adhesive 17. The carrier tape 18 also has an opposite surface to the bonding surface, wherein the opposite surface has an array of solder balls 20 which has a larger pitch than the electrode pad pitch of the silicon chip 2, so as to enable the carrier tape 18 to make an electrical connection through the larger-pitched solder balls 20 to a mother board not illustrated, wherein the carrier tape 18 serves as an interposer. The interposer allows the electrode pitch of the silicon chip to be much more narrowed than the necessary pitch of the solder balls 20 for the required external connection to the mother board the silicon chip is covered by a cover 16.

FIG. 3 is a cross sectional elevation view illustrative of a third conventional chip size package. A silicon chip 2 is bonded onto a printed wiring board 14 by a face-up bonding method. The silicon chip 2 has a face-up bonding surface which has electrode pads. The printed wiring board 14 also has a bonding surface which has bonding pads. The silicon chip 2 is placed on the printed wiring board 14 so that the electrode pads on the face-up bonding face are bonded through gold wirings 19 to the pads of the printed wiring board 14. The face-up bonding face of the silicon chip 2 and the pads of the printed wiring board 14 are sealed with a sealing resin 26 so that the gold wirings 19 are buried within the sealing resin 26. The printed wiring board 14 has an opposite surface to the bonding surface, wherein the opposite surface has an array of solder balls 20 which has a larger pitch than the electrode pad pitch of the silicon chip 2, so as to enable the printed wiring board 14 to make an electrical connection through the larger-pitched solder balls 20 to the mother board, wherein the printed wiring board 14 serves as an interposer. This interposer allows the electrode pitch of the silicon chip to be much more narrowed than the necessary pitch of the solder balls 20 for the required external connection to the mother board.

Further, in Japanese laid-open patent publication No. 7-231020, a fourth conventional chip size package is disclosed, wherein projecting bonding pads are formed on a bonding face of the silicon chip so that the bonding pads of the silicon chip are bonded through a pre-preg layer to bumps on a bonding face of a printed wiring board which further has an opposite face to the bonding face, where the opposite face has area pads.

When the second conventional chip size package is bounded on the mother board, a thermal expansion coefficient of the silicon chip 2 suppresses a thermal expansion coefficient of the carrier tape 18, resulting in a large difference in thermal expansion coefficient of the carrier tape 18 from the mother board. The large difference in thermal expansion coefficient of the carrier tape 18 from the mother board results in application of a large stress to the solder balls 20 in a test, whereby a crack is formed at connecting portions of the solder balls 20. As a result, an electrical disconnection might appear. In order to solve this problem, a resin with a low elasticity is inserted into a gap between the carrier tape 18 and the silicon chip 2. This conventional technique is disclosed in Japanese laid-open patent publication No. 8-504063.

An area array of external contacts on a silicon chip was proposed so called as "C4". This "C4" process has been practiced by IBM Corporation.

The foregoing conventional chip size packages have the following problems.

In order to form the conventional chip size packages, the silicon chip is bonded on the interposer such as the printed wiring board or the carrier tape and further the interposer with the silicon chip is mounted on the mother board. Namely, the silicon chip is bonded through the interposer onto the mother board, for which reason it is difficult for the conventional chip size packages to reduce the size, thickness, weight and the manufacturing cost. Namely, the interposer such as the printed wiring board or the carrier tape increases the size, thickness, weight and the manufacturing cost.

In accordance with the above "C4" process, external connective contacts are formed on an insulating film of the silicon chip, for which reason when the package is mounted on the mother board, a gap is formed between the package and the mother board. This gap is required to be sealed with a sealing resin. This increases the manufacturing cost and also makes it difficult to repair defective part of the package. Namely, the insulation film is an insulation film normally and often used in the manufacturing processes of the silicon chip. This insulating film has a high elastic constant. This insulating film is thin and a thickness is not larger than 10 micrometers. For those reasons, this insulating film is incapable of realization of the above thermal stress due to the large difference in thermal expansion efficient between the silicon chip and the mother board. It is therefore required to seal the gap between the silicon chip and the mother board with the sealing resin. Namely, the silicon chip and the mother board are bonded by the sealing resin, for which reason it is difficult to repair a defective part of the package.

As in the "C4" type package, the resin layer as the insulating layer is formed on the silicon wafer and further the external connective contacts are formed on the resin layer before the silicon wafer is cut to form silicon chips, whereby parts of the silicon chip circuit are shown on the cutting section. The resin is built up over the silicon wafer to form external connective electrode contacts before the wafer is cut by dicer to form chips, whereby the cutting sections are exposed to atmosphere having a high humidity.

In the above circumstances, it had been required to develop a novel chip size package free from the above problems.

SUMMARY OF THE INVENTION

Accordingly, it is an object of the present invention to provide a novel chip size package free from the above problems.

It is a further object of the present invention to provide a novel chip size package remarkably reduced in size.

It is a still further object of the present invention to provide a novel chip size package remarkably reduced in weight.

It is yet a further object of the present invention to provide a novel chip size package remarkably reduced in thickness.

It is a further object of the present invention to provide a novel chip size package which may be formed at a low manufacturing cost.

It is still another object of the present invention to provide a novel chip size package capable of a highly reliable electrical connection to a mother board.

It is moreover another object of the present invention to provide a novel chip size package capable of preventing exposure of cutting sections of the silicon chip circuits to atmosphere such as a humidity rich atmosphere.

The present invention provides a semiconductor chip having a bonding face to be mounted onto a mother board, wherein a low elastic modulus resin layer is provided in contact directly with the bonding face of the semiconductor chip without intervening any interposer to form a chip size package, and the low elastic modulus resin layer has at least a conductive pattern of a build-up type, and wherein the low elastic modulus resin layer has both a sufficiently low elastic modulus and a sufficiently large thickness for allowing realization of a stress caused due to a difference in thermal expansion coefficient between the semiconductor chip and the mother board.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
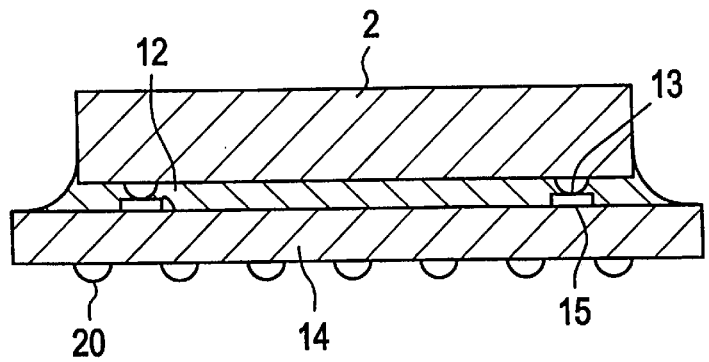
FIG. 1 is a cross sectional elevation view illustrative of a first conventional chip size package.
Figure 2:
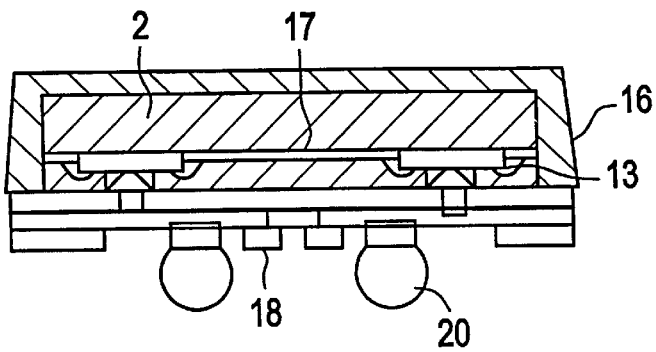
FIG. 2 is a cross sectional elevation view illustrative of a second conventional chip size package.
Figure 3:
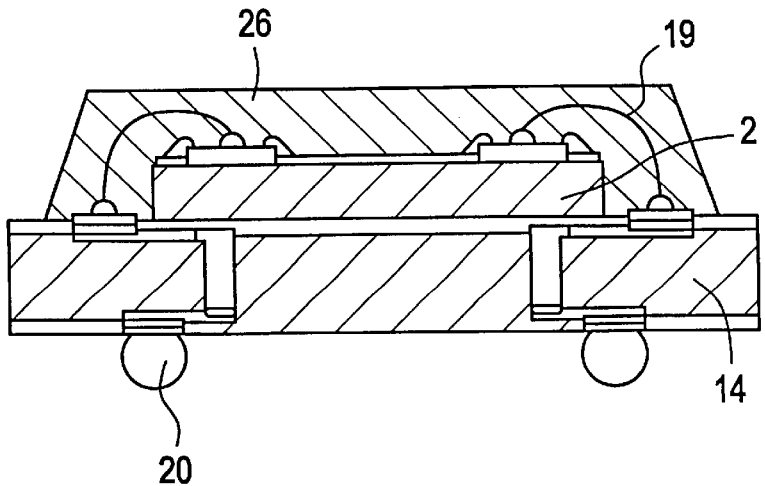
FIG. 3 is a cross sectional elevation view illustrative of a third conventional chip size package.

The first present invention provides a semiconductor chip having a bonding face to be mounted onto a mother board, wherein a low elastic modulus resin layer is provided in contact directly with the bonding face of the semiconductor chip without intervening any interposer to form a chip size package, and the low elastic modulus resin layer has at least a conductive pattern of a build-up type, and wherein the low elastic modulus resin layer has both a sufficiently low elastic modulus and a sufficiently large thickness for allowing realization of a stress caused due to a difference in thermal expansion coefficient between the semiconductor chip and the mother board.

It is preferable that the bonding face of the semiconductor chip has area type conductive pads provided in a peripheral region thereof.

It is also preferable that the low elastic modulus resin layer is so thick as to have a thickness of not more than 20 micrometers.

It is also preferable that the low elastic modulus resin layer has an elastic modulus of not higher than 200 kgf/mm$^2$.

It is further preferable that the low elastic modulus resin layer has an elastic modulus of not higher than 10 kgf/mm$^2$.

It is also preferable that the semiconductor chip comprises a silicon chip.

It is also preferable that the low elastic modulus resin layer extends to cover cutting sections of the semiconductor chip.

It is also preferable that the conductive pattern of the build-up type has a thickness of not less than 5 micrometers.

The second present invention provides a chip size package having a semiconductor chip having a bonding face to be mounted onto a mother board, wherein a low elastic modulus resin layer is provided in contact directly with the bonding face of the semiconductor chip without intervening any interposer, and the low elastic modulus resin layer has holes positioned over conductive pads on the bonding face of the semiconductor chip, and conductive patterns of a build-up type are formed which extend from the conductive pads to externally connective contacts over the low elastic modulus resin layer, and further a solder resist layer is further provided to cover parts of the externally connective contacts and also cover the low elastic modulus resin layer, and wherein the low elastic modulus resin layer has both a sufficiently low elastic modulus and a sufficiently large thickness for allowing realization of a stress caused due to a difference in thermal expansion coefficient between the semiconductor chip and the mother board.

It is preferable that the bonding face of the semiconductor chip has area type conductive pads provided in a peripheral region thereof.

It is also preferable that the low elastic modulus resin layer is so thick as to have a thickness of not more than 20 micrometers.

It is also preferable that the low elastic modulus resin layer has an elastic modulus of not higher than 200 kgf/mm$^2$.

It is further preferable that the low elastic modulus resin layer has an elastic modulus of not higher than 10 kgf/mm$^2$.

It is also preferable that the semiconductor chip comprises a silicon chip.

It is also preferable that the low elastic modulus resin layer extends to cover cutting sections of the semiconductor chip.

It is also preferable that the conductive pattern of the build-up type has a thickness of not less than 5 micrometers.

The third present invention provides a method of forming a semiconductor chip having a bonding face to be mounted onto a mother board. The method comprises the steps of: forming a low elastic modulus resin layer in contact directly with the bonding face of the semiconductor chip without intervening any interposer to form a chip size package; and forming at least a conductive pattern of a build-up type in the low elastic modulus resin layer, and wherein the low elastic modulus resin layer has both a sufficiently low elastic modulus and a sufficiently large thickness for allowing realization of a stress caused due to a difference in thermal expansion coefficient between the semiconductor chip and the mother board.

It is preferable that area type conductive pads are further formed in a peripheral region of the bonding face of the semiconductor chip.

It is also preferable that the low elastic modulus resin layer is so formed as to have a thickness of not more than 20 micrometers.

It is also preferable that the low elastic modulus resin layer is formed by selecting a resin material which has an elastic modulus of not higher than 200 kgf/mm$^2$.

It is further preferable that the low elastic modulus resin layer is formed by selecting a resin material which has an elastic modulus of not higher than 10 kgf/mm$^2$.

It is also preferable that scribe grooves are formed in the semiconductor chip and then the low elastic modulus resin layer is so formed as to fill the scribe grooves to cover walls of the scribe grooves, so that the semiconductor chip is cut along the scribe grooves whereby cutting sections of the semiconductor chips are covered with the low elastic modulus resin layer.

It is also preferable that the conductive pattern of the build-up type is formed to have a thickness of not less than 5 micrometers.

PREFERRED EMBODIMENTS

Figure 4A:
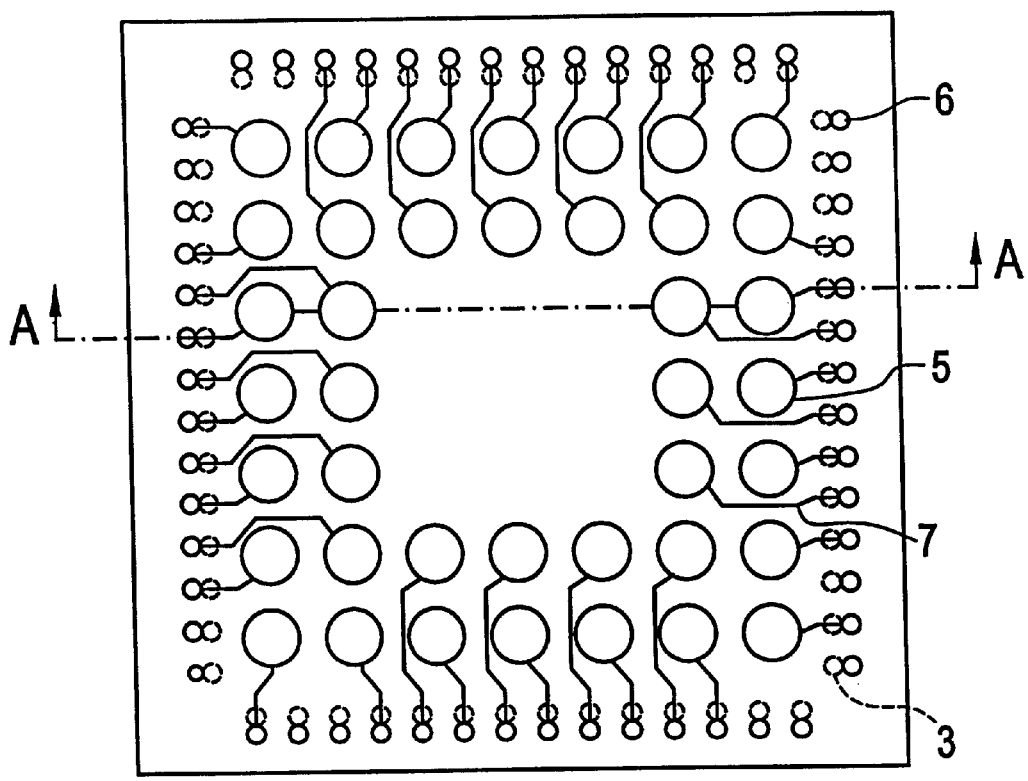
FIG. 4A is a plane view illustrative of a novel chip size package semiconductor device in a first embodiment in accordance with the present invention.
Figure 4B:
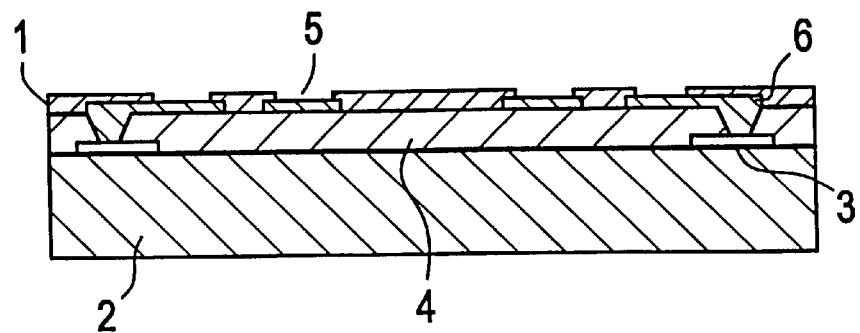
FIG. 4B is a cross sectional elevation view illustrative of a novel chip size package semiconductor device taken along an A-A line of FIG. 4A in a first embodiment in accordance with the present invention.

First Embodiment:

A first embodiment according to the present invention will be described in detail with reference to FIGS. 4A and 4B. FIG. 4A is a plane view illustrative of a novel chip size package semiconductor device in a first embodiment in accordance with the present invention. FIG. 4B is a cross sectional elevation view illustrative of a novel chip size package semiconductor device taken along an A-A line of FIG. 4A in a first embodiment in accordance with the present invention.

The novel chip size package semiconductor device has a silicon chip 2 which is square-shaped. Aluminum pads 3 are provided on the surface of the silicon chip 2. The aluminum pads 3 are positioned in peripheral regions of the surface of the silicon chip 2 and further aligned in parallel to four sides of the square-shaped silicon chip 2. A low elastic modulus resin layer 4 is provided in directly contact with a surface of the silicon chip 2. The low elastic modulus resin layer 4 has holes which are positioned over the aluminum pads 3, whereby the holes are also positioned in the peripheral regions of the surface of the silicon chip 2 and further aligned in parallel to the four sides of the square-shaped silicon chip 2. Electrically conductive plugs 6 are provided in the holes and over the low elastic modulus resin layer 4 in the vicinity of the holes, so that the electrically conductive plugs 6 are positioned in peripheral regions of the surface of the silicon chip 2 and further aligned in parallel to four sides of the square-shaped silicon chip 2. Externally connective contacts 5 are also provided over the low elastic modulus resin layer 4, so that the externally connective contacts 5 are positioned inside of the electrically conductive plugs 6 to form dual alignments extending in parallel to the four sides of the square-shaped silicon chip 2, whereby the dual alignments of the externally connective contacts 5 form a grid array. A solder resist layer 1 is provided over the low elastic modulus resin layer 4. The solder resist layer 1 overlies electrically conductive patterns 7, wherein the electrically conductive patterns 7 provide electrical connections between the externally connective contacts 5 and the electrically conductive plugs 6.

The externally connective contacts 5 may comprise a copper plated layer which has a thickness of 10 micrometers. The low elastic modulus resin layer 4 may comprise a low elastic modulus epoxy resin which has a thickness of 40 micrometers. The low elastic modulus resin layer 4 may have an elastic modulus in the range of 1–10 kgf/mm$^2$. The holes of the low elastic modulus resin layer 4 may have a size of 50 micrometers. The electrically conductive plugs 6 may be made of a silver epoxy. The electrically conductive patterns 7 provide electrical connections between the externally connective contacts 5 and the electrically conductive plugs 6. The solder resist layer 1 may be optionally photosensitive and has a thickness in the range of 10–20 micrometers.

As a modification to the above first embodiment, none of electrically conductive patterns 7 may be formed whilst the electrically conductive plugs 6 have extending portions which extend over the low elastic modulus resin layer 4, so that the extending portions of the electrically conductive plugs 6 provide electrical connections between the externally connective contacts 5 and the electrically conductive plugs 6.

The above novel chip size package semiconductor device to be mounted onto a mother board may be formed as follows. FIGS. 5A through 5I are cross sectional elevation views illustrative of novel chip size package semiconductor devices in sequential steps involved in a novel fabrication method in a first embodiment in accordance with the present invention.

Figure 5A:
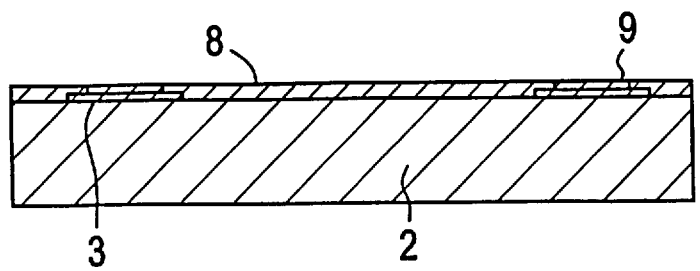
FIGS. 5A through 5I are cross sectional elevation views illustrative of novel chip size package semiconductor devices in sequential steps involved in a novel fabrication method in a first embodiment in accordance with the present invention.

With reference to FIG. 5A, a silicon chip 2 is prepared before electrode pads 3 are formed on a surface of the silicon chip 2. The electrode pads 3 may be made of aluminum. Further, additional electrode pads 9 are also formed on the electrode pads 3. The electrode pads 3 may optionally be plated with gold. A polyimide film 8 is selectively formed to form a part of interconnection layers. As a modification, a silicon nitride film may be formed in place of the polyimide film 8. Further, alternatively, no polyimide film nor silicon nitride film may be formed.

Figure 5B:
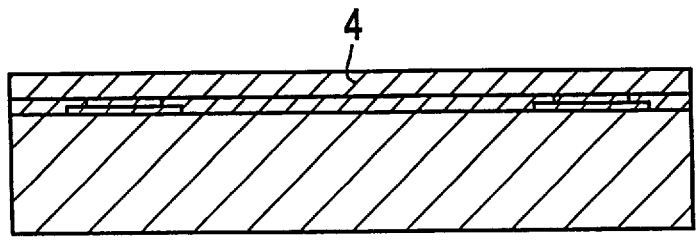

With reference to FIG. 5B, a low elastic modulus resin layer 4 is formed which extends over the polyimide film 8 and the surface of the silicon chip 2. The low elastic modulus resin layer 4 may be formed by applying a liquid type resin over the polyimide film 8 and the surface of the silicon chip 2 by use of a spin coater, a curtain coater or a slot coater before the applied resin is dried and subsequently cured. Alternatively, the low elastic modulus resin layer 4 may be formed by laminating a dry film type resin over the polyimide film 8 and the surface of the silicon chip 2 by use of a laminator before the laminated resin is cured.

Figure 5C:
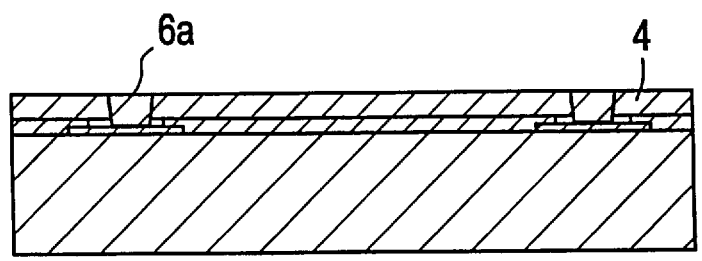

With reference to FIG. 5C, holes are formed in the low elastic modulus resin layer 4, so that the holes are positioned over the electrode pads 3, whereby parts of the electrode pads 3 are shown through the holes. Electrically conductive pastes 6a are filled into the holes so that the electrically conductive pastes 6a are made into contact with the electrode pads 3. The holes of the low elastic modulus resin layer 4 may be formed by irradiation of a laser beam onto the low elastic modulus resin layer 4, so that the parts of the electrode pads 3 are shown through the holes. Alternatively, if the low elastic modulus resin layer 4 is made of a photo-sensitive resin material, then the holes may be formed by exposure and subsequent development processes.

Figure 5D:
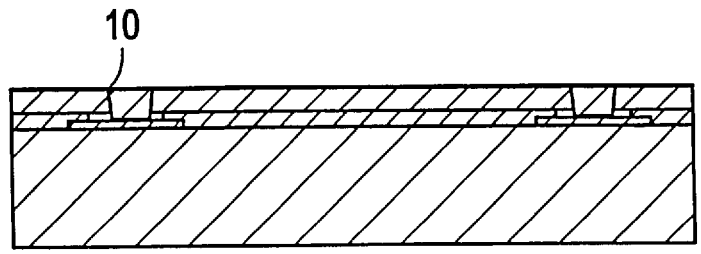

With reference to FIG. 5D, a sputter metal film 10 is formed which extends over the low elastic modulus resin layer 4 and the electrically conductive pastes 6a by use of a sputtering method. The sputter metal film 10 has a thickness of about 1 micrometers and comprise a Cr—Pd—Cu layer or a W—Pd—Cu layer. Alternatively, the metal film 10 may comprise an electroless-plating copper film having a thickness in the range of 1–2 micrometers.

Figure 5E:
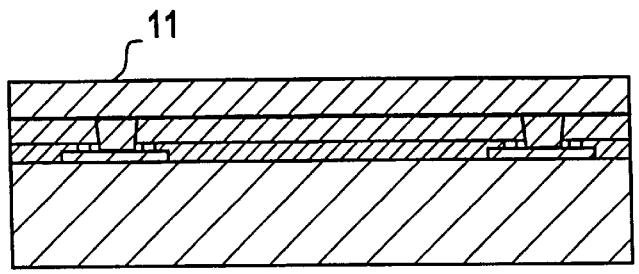

With reference to FIG. 5E, a plating resist film 11 is formed over the sputter metal films 10. The plating resist film 11 has a thickness in the range of 10–40 micrometers. The thickness of the plating resist film 11 is decided to correspond to an electro-plating copper film.

Figure 5F:
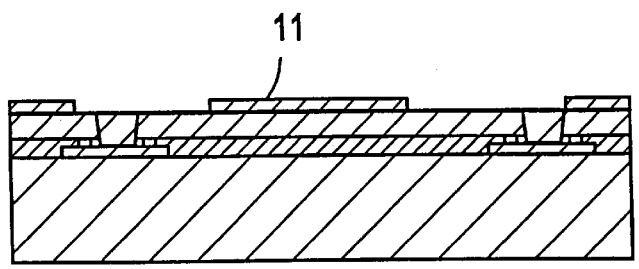

With reference to FIG. 5F, the plating resist film 11 is then subjected to an exposure and subsequent development to pattern the plating resist film 11, whereby a plating resist mask 11' is formed, and also whereby the sputter metal films 10 and parts of the low elastic modulus resin layer 4 are shown through apertures of the plating resist mask 11'.

Figure 5G:
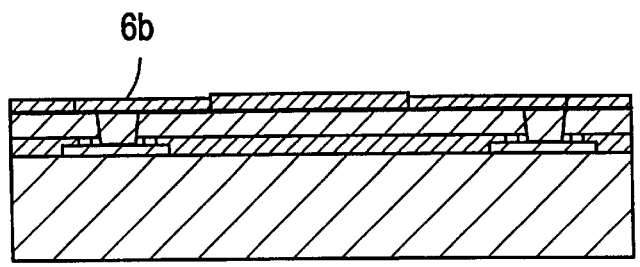

With reference to FIG. 5G, electro-plating copper films 6b are selectively formed in the apertures of the plating resist mask 11' and over the sputter metal films 10 and parts of the low elastic modulus resin layer 4, whereby the electro-plating copper films 6b are made into contact with the sputter metal films 10.

Figure 5H:
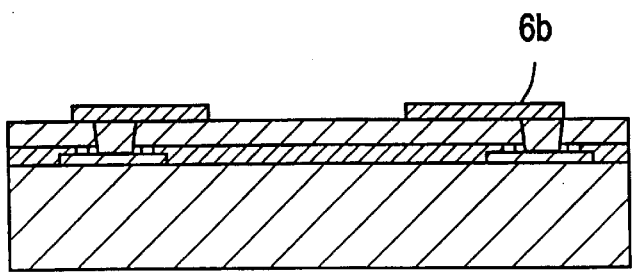

With reference to FIG. 5H, the plating resist mask 11' is removed, whereby parts of the sputter metal films 10 are shown through apertures of the electro-plating copper films 6b. The shown parts of the sputter metal films 10 are chemically removed by an etching method using a soft etchant including hydrogen peroxide and sulfuric acid. Alternatively, the shown parts of the sputter metal films 10 may physically be removed by a polishing method using a buff or a brush.

Figure 5I:
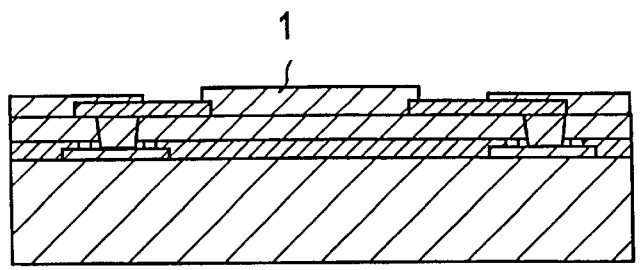

With reference to FIG. 5I, a solder resist layer 1 is selectively formed over the low elastic modulus resin layer 4 and parts of the electro-plating copper films 6b, so that parts of the electro-plating copper films 6b are shown through apertures of the solder resist layer 1, whereby the shown parts of the electro-plating copper films 6b serve as the externally connective contacts 5. Further, solder balls may if any be formed on the externally connective contacts 5 to form projecting externally connective contacts.

In accordance with the first novel chip size package of this embodiment, the low elastic modulus resin layer is provided in directly contact with the surface of the silicon chip and externally connective contacts or electrodes of build-up type are formed on the low elastic modulus resin layer without intervening any interposer such as a printed circuit board or a carrier tape. No provision of any interposer reduces the weight of the chip size package. No provision of any interposer reduces also reduces thickness of the chip size package. Usually, the interposer is likely to be expensive. No provision of any interposer reduces the manufacturing cost.

Further, the low elastic modulus resin layer has a sufficiently low elastic modulus and a sufficiently large thickness for allowing relaxation of the stress due to a large difference in thermal expansion coefficient between the silicon chip and the mother board, thereby securing electrical connection between the silicon chip and the mother board.

Figure 6:
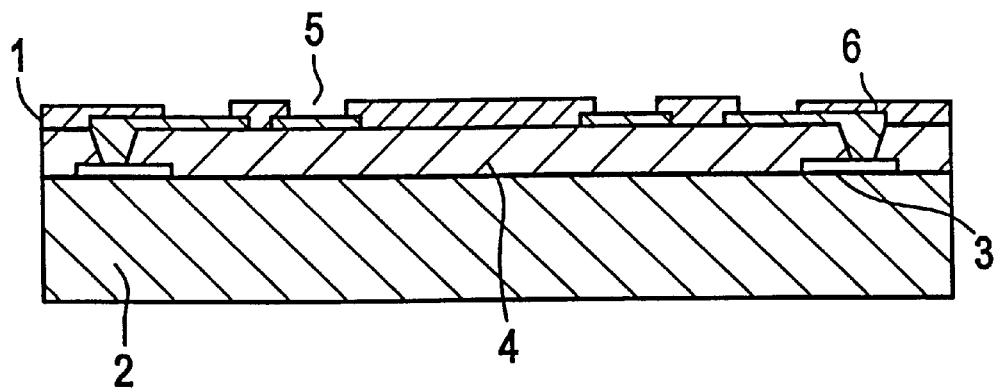
FIG. 6 is a cross sectional elevation view illustrative of a novel chip size package semiconductor device in a second embodiment in accordance with the present invention.

Second Embodiment:

A second embodiment according to the present invention will be described in detail with reference to FIG 6. FIG. 6 is a cross sectional elevation view illustrative of a novel chip size package semiconductor device in a second embodiment in accordance with the present invention.

The novel chip size package semiconductor device has a silicon chip 2 which is square-shaped. Aluminum pads 3 are provided on the surface of the silicon chip 2. The aluminum pads 3 are positioned in peripheral regions of the surface of the silicon chip 2 and further aligned in parallel to four sides of the square-shaped silicon chip 2. A low elastic modulus resin layer 4 is provided in directly contact with a surface of the silicon chip 2. The low elastic modulus resin layer 4 has holes which are positioned over the aluminum pads 3, whereby the holes are also positioned in the peripheral regions of the surface of the silicon chip 2 and further aligned in parallel to the four sides of the square-shaped silicon chip 2. Electrically conductive plugs 6 are provided in the holes and over the low elastic modulus resin layer 4 in the vicinity of the holes, so that the electrically conductive plugs 6 are positioned in peripheral regions of the surface of the silicon chip 2 and further aligned in parallel to four sides of the square-shaped silicon chip 2. Externally connective contacts 5 are also provided over the low elastic modulus resin layer 4, so that the externally connective contacts 5 are positioned inside of the electrically conductive plugs 6 to form dual alignments extending in parallel to the four sides of the square-shaped silicon chip 2, whereby the dual alignments of the externally connective contacts 5 form a grid array. A solder resist layer 1 is provided over the low elastic modulus resin layer 4. The solder resist layer 1 overlies electrically conductive patterns 7, wherein the electrically conductive patterns 7 provide electrical connections between the externally connective contacts 5 and the electrically conductive plugs 6.

The externally connective contacts 5 may comprise a copper plated layer which has a thickness of 10 micrometers.

The low elastic modulus resin layer 4 may comprise a low elastic modulus epoxy resin which has a thickness of 40 micrometers. The low elastic modulus resin layer 4 may have an elastic modulus in the range of 1–10 kgf/mm$^2$. The holes of the low elastic modulus resin layer 4 may have a size of 50 micrometers. The electrically conductive plugs 6 may be made of a silver epoxy. The electrically conductive patterns 7 provide electrical connections between the externally connective contacts 5 and the electrically conductive plugs 6. The solder resist layer 1 may be optionally photosensitive and has a thickness in the range of 10–20 micrometers.

As a modification to the above first embodiment, none of electrically conductive patterns 7 may be formed whilst the electrically conductive plugs 6 have extending portions which extend over the low elastic modulus resin layer 4, so that the extending portions of the electrically conductive plugs 6 provide electrical connections between the externally connective contacts 5 and the electrically conductive plugs 6.

The above novel chip size package semiconductor device to be mounted onto a mother board may be formed as follows. FIGS. 7A through 7I are cross sectional elevation views illustrative of novel chip size package semiconductor devices in sequential steps involved in a novel fabrication method in a second embodiment in accordance with the present invention.

Figure 7A:
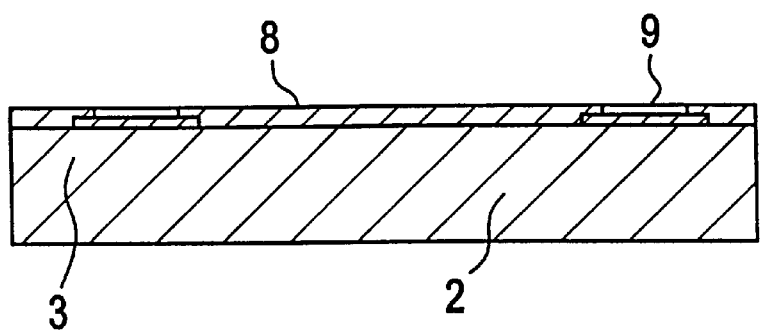
FIGS. 7A through 7I are cross sectional elevation views illustrative of novel chip size package semiconductor devices in sequential steps involved in a novel fabrication method in a second embodiment in accordance with the present invention.

With reference to FIG. 7A, a silicon chip 2 is prepared before electrode pads 3 are formed on a surface of the silicon chip 2. The electrode pads 3 may be made of aluminum. Further, additional electrode pads 9 are also formed on the electrode pads 3. The electrode pads 3 may optionally be plated with gold. A polyimide film 8 is selectively formed to form a part of interconnection layers. As a modification, a silicon nitride film may be formed in place of the polyimide film 8. Further, alternatively, no polyimide film nor silicon nitride film may be formed.

Figure 7B:
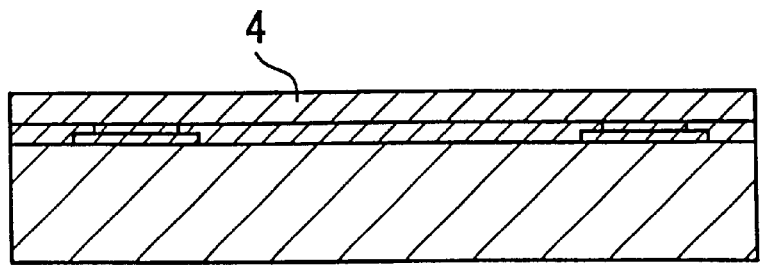

With reference to FIG. 7B, a low elastic modulus resin layer 4 is formed which extends over the polyimide film 8 and the surface of the silicon chip 2. The low elastic modulus resin layer 4 may be formed by applying a liquid type resin over the polyimide film 8 and the surface of the silicon chip 2 by use of a spin coater, a curtain coater or a slot coater before the applied resin is dried and subsequently cured. Alternatively, the low elastic modulus resin layer 4 may be formed by laminating a dry film type resin over the polyimide film 8 and the surface of the silicon chip 2 by use of a laminator before the laminated resin is cured.

Figure 7C:
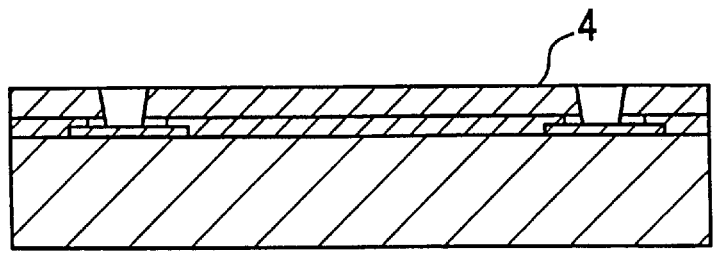

With reference to FIG. 7C, holes are formed in the low elastic modulus resin layer 4, 50 that the holes are positioned over the electrode pads 3, whereby parts of the electrode pads 3 are shown through the holes.

Figure 7D:
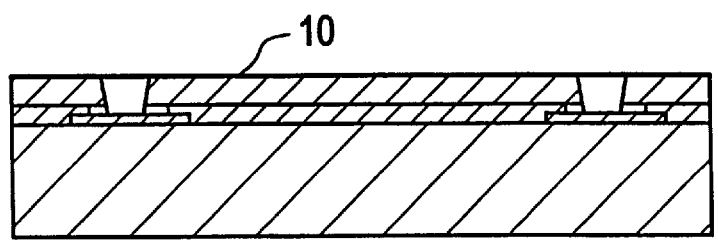

With reference to FIG. 7D, a sputter metal film 10 is formed which extends over the low elastic modulus resin layer 4 and on side walls of the holes and bottoms of the holes by use of a sputtering method. The sputter metal film 10 has a thickness of about 1 micrometers and comprise a Cr—Pd—Cu layer or a W—Pd—Cu layer. Alternatively, the metal film 10 may comprise an electroless-plating copper film having a thickness in the range of 1–2 micrometers.

Figure 7E:
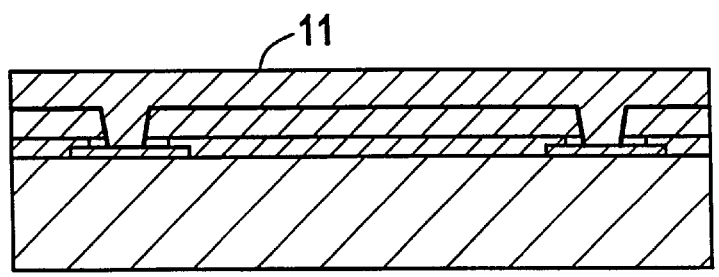

With reference to FIG. 7E, a plating resist film 11 is formed over the sputter metal films 10. The plating resist film 11 has a thickness in the range of 10–40 micrometers. The thickness of the plating resist film 11 is decided to correspond to an electro-plating copper film.

Figure 7F:
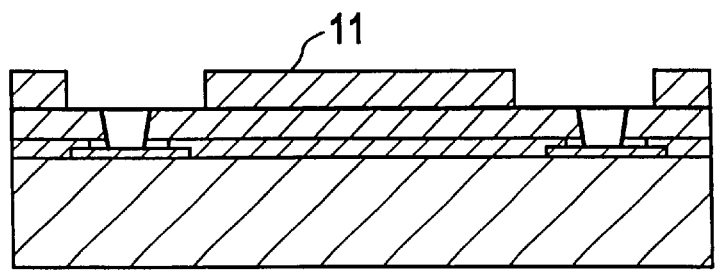

With reference to FIG. 7F, the plating resist film 11 is then subjected to an exposure and subsequent development to pattern the plating resist film 11, whereby a plating resist mask 11' is formed, and also whereby the sputter metal films 10 and parts of the low elastic modulus resin layer 4 are shown through apertures of the plating resist mask 11'.

Figure 7G:
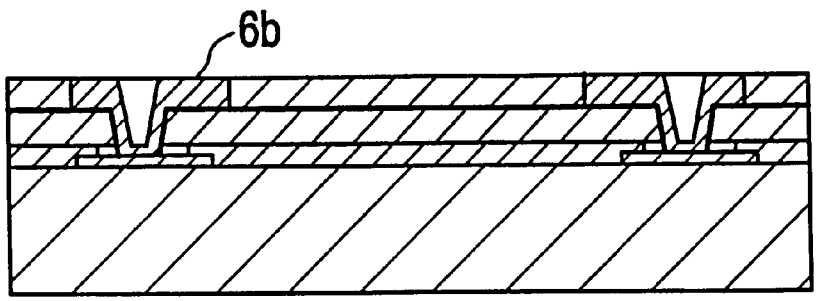

With reference to FIG. 7G, electro-plating copper films 6b are selectively formed in the apertures of the plating resist mask 11' and within the holes so that the electro-plating copper films 6b extend over the sputter metal films 10 and parts of the low elastic modulus resin layer 4.

Figure 7H:
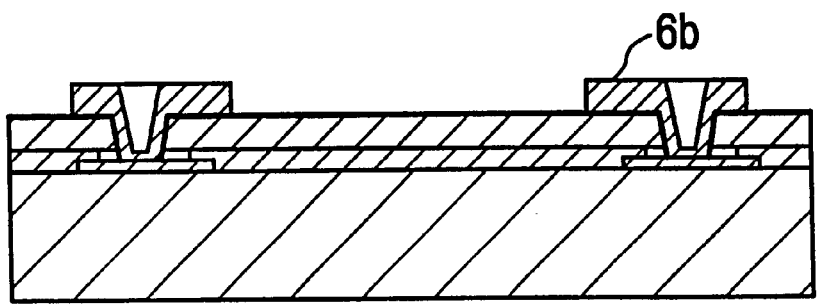

With reference to FIG. 7H, the plating resist mask 11' is removed, whereby parts of the sputter metal films 10 are shown through apertures of the electro-plating copper films 6b. The shown parts of the sputter metal films 10 are chemically removed by an etching method using a soft etchant including hydrogen peroxide and sulfuric acid. Alternatively, the shown parts of the sputter metal films 10 may physically be removed by a polishing method using a buff or a brush.

Figure 7I:
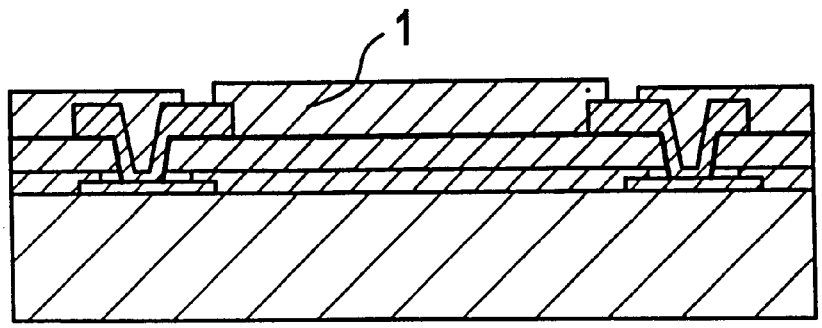

With reference to FIG. 7I, a solder resist layer 1 is selectively formed over the low elastic modulus resin layer 4 and parts of the electro-plating copper films 6b, so that parts of the electro-plating copper films 6b are shown through apertures of the solder resist layer 1, whereby the shown parts of the electro-plating copper films 6b serve as the externally connective contacts 5. Further, solder balls may if any be formed on the externally connective contacts 5 to form projecting externally connective contacts.

In accordance with the second novel chip size package of this embodiment, the low elastic modulus resin layer is provided in directly contact with the surface of the silicon chip and externally connective contacts or electrodes of build-up type are formed on the low elastic modulus resin layer without intervening any interposer such as a printed circuit board or a carrier tape. No provision of any interposer reduces the weight of the chip size package. No provision of any interposer reduces also reduces thickness of the chip size package. Usually, the interposer is likely to be expensive. No provision of any interposer reduces the manufacturing cost.

Further, the low elastic modulus resin layer has a sufficiently low elastic modulus and a sufficiently large thickness for allowing relaxation of the stress due to a large difference in thermal expansion coefficient between the silicon chip and the mother board, thereby securing electrical connection between the silicon chip and the mother board.

Figure 8:
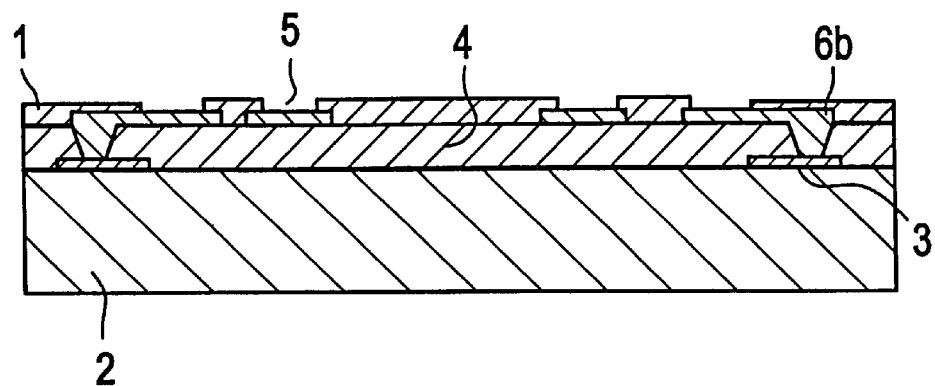
FIG. 8 is a cross sectional elevation view illustrative of a novel chip size package semiconductor device in a third embodiment in accordance with the present invention.

Third Embodiment:

A third embodiment according to the present invention will be described in detail with reference to FIG. 8. FIG. 8 is a cross sectional elevation view illustrative of a novel chip size package semiconductor device in a third embodiment in accordance with the present invention.

The novel chip size package semiconductor device has a silicon chip 2 which is square-shaped. Aluminum pads 3 are provided on the surface of the silicon chip 2. The aluminum pads 3 are positioned in peripheral regions of the surface of the silicon chip 2 and further aligned in parallel to four sides of the square-shaped silicon chip 2. A low elastic modulus resin layer 4 is provided in directly contact with a surface of the silicon chip 2. The low elastic modulus resin layer 4 has holes which are positioned over the aluminum pads 3, whereby the holes are also positioned in the peripheral regions of the surface of the silicon chip 2 and further aligned in parallel to the four sides of the square-shaped silicon chip 2. Electrically conductive plugs 6 are provided in the holes and over the low elastic modulus resin layer 4 in the vicinity of the holes, so that the electrically conductive plugs 6 are positioned in peripheral regions of the surface of the silicon chip 2 and further aligned in parallel to four sides of the square-shaped silicon chip 2. Externally connective contacts 5 are also provided over the low elastic modulus resin layer 4, so that the externally connective contacts 5 are positioned inside of the electrically conductive plugs 6 to form dual alignments extending in parallel to the four sides of the square-shaped silicon chip 2, whereby the dual alignments of the externally connective contacts 5 form a grid array. A solder resist layer 1 is provided over the low elastic modulus resin layer 4. The solder resist layer 1 overlies electrically conductive patterns 7, wherein the electrically conductive patterns 7 provide electrical connections between the externally connective contacts 5 and the electrically conductive plugs 6.

The externally connective contacts 5 may comprise a copper plated layer which has a thickness of 10 micrometers. The low elastic modulus resin layer 4 may comprise a low elastic modulus epoxy resin which has a thickness of 40 micrometers. The low elastic modulus resin layer 4 may have an elastic modulus in the range of 1–10 kgf/mm$^2$. The holes of the low elastic modulus resin layer 4 may have a size of 50 micrometers. The electrically conductive plugs 6 may be made of a silver epoxy. The electrically conductive patterns 7 provide electrical connections between the externally connective contacts 5 and the electrically conductive plugs 6. The solder resist layer 1 may be optionally photosensitive and has a thickness in the range of 10–20 micrometers.

As a modification to the above first embodiment, none of electrically conductive patterns 7 may be formed whilst the electrically conductive plugs 6 have extending portions which extend over the low elastic modulus resin layer 4, so that the extending portions of the electrically conductive plugs 6 provide electrical connections between the externally connective contacts 5 and the electrically conductive plugs 6.

The above novel chip size package semiconductor device to be mounted onto a mother board may be formed as follows. FIGS. 9A through 9K are cross sectional elevation views illustrative of novel chip size package semiconductor devices in sequential steps involved in a novel fabrication method in a third embodiment in accordance with the present invention.

Figure 9A:
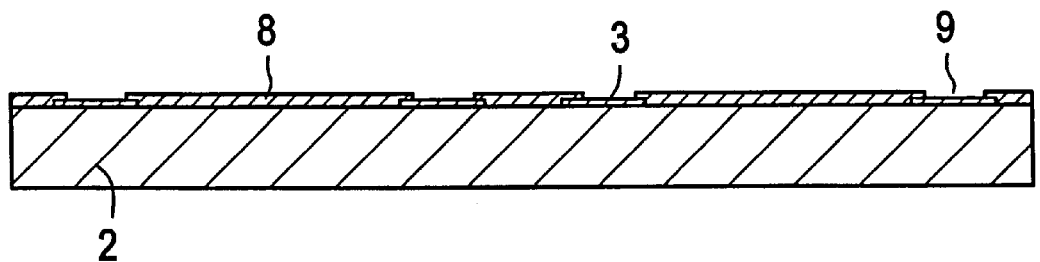
FIGS. 9A through 9K are cross sectional elevation views illustrative of novel chip size package semiconductor devices in sequential steps involved in a novel fabrication method in a third embodiment in accordance with the present invention.

With reference to FIG. 9A, a silicon chip 2 is prepared before electrode pads 3 and additional electrode pads 9 are formed on a surface of the silicon chip 2. The electrode pads 3 may be made of aluminum. The electrode pads 3 may optionally be plated with gold. A polyimide film 8 is selectively formed to form a part of interconnection layers. As a modification, a silicon nitride film may be formed in place of the polyimide film 8. Further, alternatively, no polyimide film nor silicon nitride film may be formed.

Figure 9B:
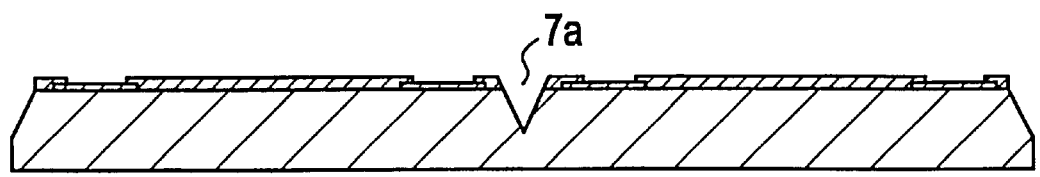

With reference to FIG. 9B, V-shaped scribe grooves 7a are formed which extends through an upper region of the silicon chip 2. The V-shaped scribe grooves 7a have a width of 100 micrometers and a depth of 200 micrometers.

Figure 9C:
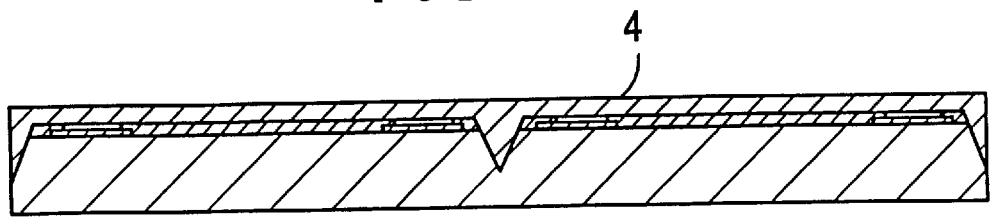

With reference to FIG. 9C, a low elastic modulus resin layer 4 is formed which extends over the polyimide film 8 and the surface of the silicon chip 2, whereby the V-shaped scribe grooves 7a are filled with the low elastic modulus resin layer 4. The low elastic modulus resin layer 4 may be formed by applying a liquid type resin over the polyimide film 8 and the surface of the silicon chip 2 by use of a spin coater, a curtain coater or a slot coater before the applied resin is dried and subsequently cured. Alternatively, the low elastic modulus resin layer 4 may be formed by laminating a dry film type resin over the polyimide film 8 and the surface of the silicon chip 2 by use of a laminator before the laminated resin is cured.

Figure 9D:
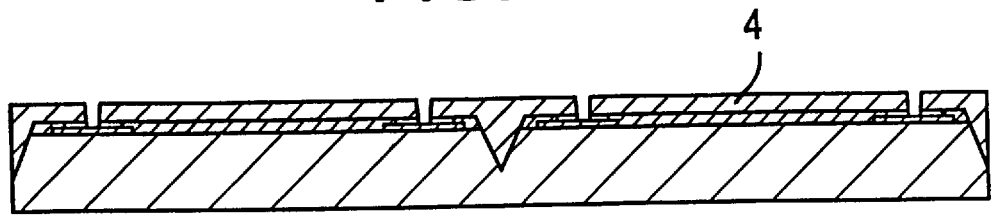

With reference to FIG. 9D, holes are formed in the low elastic modulus resin layer 4, so that the holes are positioned over the electrode pads 3, whereby parts of the electrode pads 3 are shown through the holes. Electrically conductive pastes 6a are filled into the holes so that the electrically conductive pastes 6a are made into contact with the electrode pads 3. The holes of the low elastic modulus resin layer 4 may be formed by irradiation of a laser beam onto the low elastic modulus resin layer 4, so that the parts of the electrode pads 3 are shown through the holes. Alternatively, if the low elastic modulus resin layer 4 is made of a photo-sensitive resin material, then the holes may be formed by exposure and subsequent development processes.

Figure 9E:
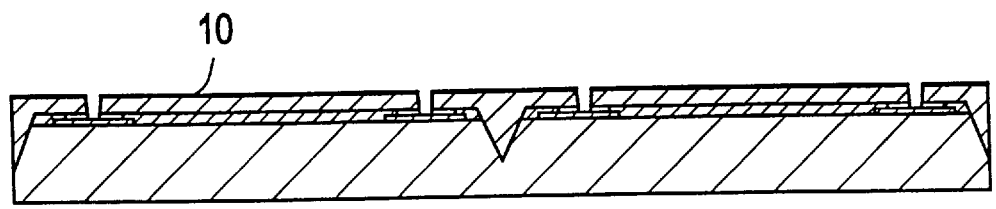

With reference to FIG. 9E, a sputter metal film 10 is formed which extends over the low elastic modulus resin layer 4 and on side walls of the holes as well as bottoms of the holes by use of a sputtering method. The sputter metal film 10 has a thickness of about 1 micrometers and comprise a Cr—Pd—Cu layer or a W—Pd—Cu layer. Alternatively, the metal film 10 may comprise an electroless-plating copper film having a thickness in the range of 1–2 micrometers.

Figure 9F:
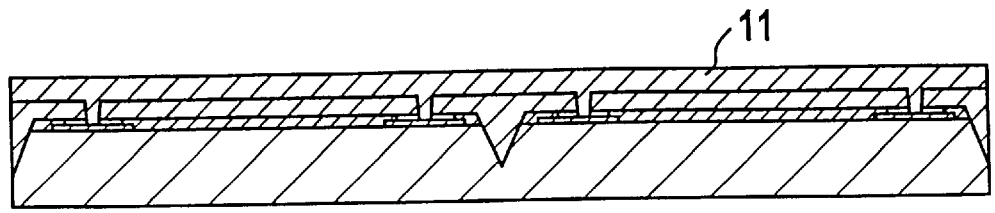

With reference to FIG. 9F, a plating resist film 11 is formed over the sputter metal films 10. The plating resist film 11 has a thickness in the range of 10–40 micrometers. The thickness of the plating resist film 11 is decided to correspond to an electro-plating copper film.

Figure 9G:
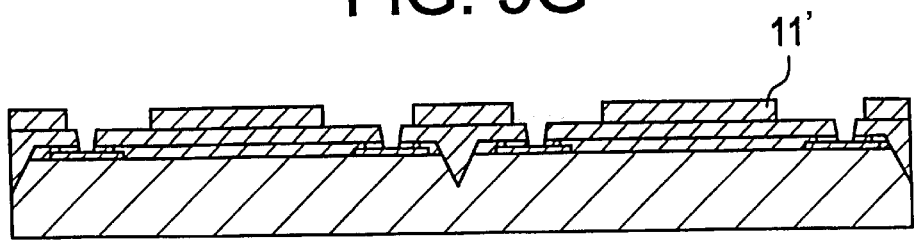

With reference to FIG. 9G, the plating resist film 11 is then subjected to an exposure and subsequent development to pattern the plating resist film 11, whereby a plating resist mask 11' is formed, and also whereby the sputter metal films 10 and parts of the low elastic modulus resin layer 4 are shown through apertures of the plating resist mask 11'.

Figure 9H:
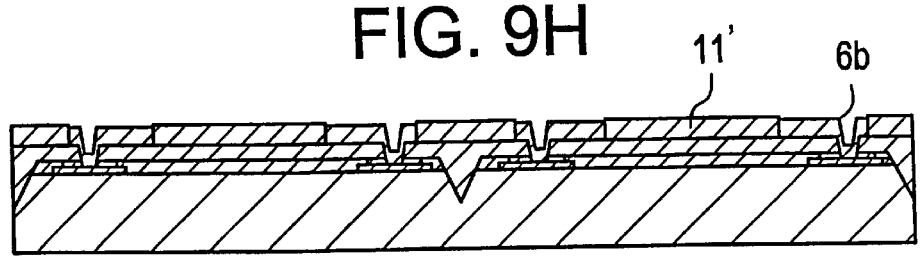

With reference to FIG. 9H, electro-plating copper films 6b are selectively formed in the apertures of the plating resist mask 11' and on the side walls of the holes and on the bottoms of the holes so that the electro-plating copper films 6b extend over the sputter metal films 10 and parts of the low elastic modulus resin layer 4, whereby the electro-plating copper films 6b are made into contact with the sputter metal films 10.

Figure 9I:
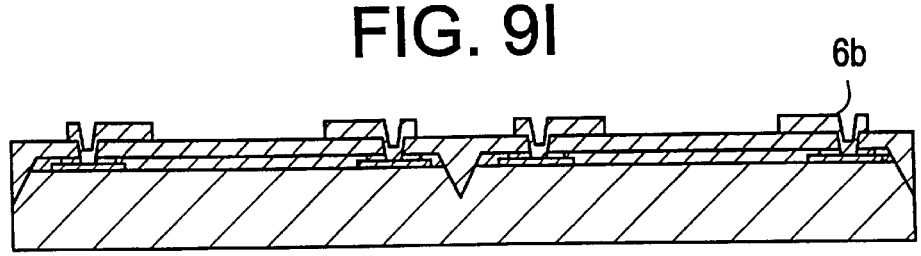

With reference to FIG. 9I, the plating resist mask 11' is removed, whereby parts of the sputter metal films 10 are shown through apertures of the electro-plating copper films 6b. The shown parts of the sputter metal films 10 are chemically removed by an etching method using a soft etchant including hydrogen peroxide and sulfuric acid. Alternatively, the shown parts of the sputter metal films 10 may physically be removed by a polishing method using a buff or a brush.

Figure 9J:
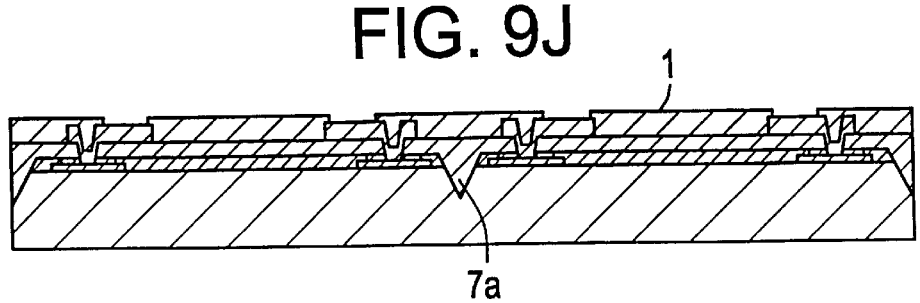

With reference to FIG. 9J, a solder resist layer 1 is selectively formed over the low elastic modulus resin layer 4 and parts of the electro-plating copper films 6b, so that parts of the electro-plating copper films 6b are shown through apertures of the solder resist layer 1, whereby the shown parts of the electro-plating copper films 6b serve as the externally connective contacts 5.

Figure 9K:
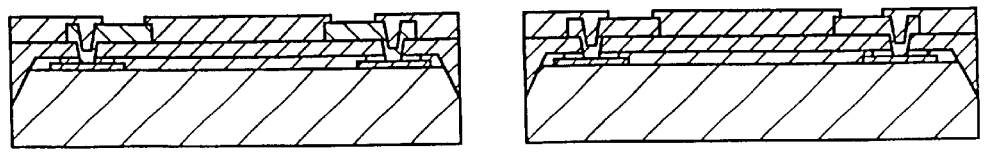

With reference to FIG. 9K, the silicon chip 2 is cut along the V-shaped scribe grooves 7a so that the cut silicon chips have cutting sections which are coated by the low elastic modulus resin layer 4. Further, solder balls may if any be formed on the externally connective contacts 5 to form projecting externally connective contacts.

In accordance with the third novel chip size package of this embodiment, the low elastic modulus resin layer is provided in directly contact with the surface of the silicon chip and externally connective contacts or electrodes of build-up type are formed on the low elastic modulus resin layer without intervening any interposer such as a printed circuit board or a carrier tape. No provision of any interposer reduces the weight of the chip size package. No provision of any interposer reduces also reduces thickness of the chip size package. Usually, the interposer is likely to be expensive. No provision of any interposer reduces the manufacturing cost.

Further, the low elastic modulus resin layer has a sufficiently low elastic modulus and a sufficiently large thickness for allowing relaxation of the stress due to a large difference in thermal expansion coefficient between the silicon chip and the mother board, thereby securing electrical connection between the silicon chip and the mother board.

Furthermore, the V-shaped scribe groove is formed in the upper portion of the silicon chip and then the V-shaped scribe groove is filled with the low elastic modulus resin layer, whereby the silicon chip is cut and the cutting sections of the silicon chips are covered or coated by the low elastic modulus resin layer.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a semiconductor chip having a bonding face to be mounted onto a mother board, said method comprising the steps of:

forming a low elastic modulus resin layer in contact directly with said bonding face of said semiconductor chip without intervening any interposer to form a chip size package; and forming at least a conductive pattern of a build-up type in said low elastic modulus resin layer, and wherein said low elastic modulus resin layer has both a sufficiently low elastic modulus and a sufficiently large thickness for allowing realization of a stress caused due to a difference in thermal expansion coefficient between said semiconductor chip and said mother board.

2. The method as claimed in claim 1, wherein area type conductive pads are further formed in a peripheral region of said bonding face of said semiconductor chip.

3. The method as claimed in claim 1, wherein said low elastic modulus resin layer is so formed as to have a thickness of not more than 20 micrometers.

4. The method as claimed in claim 1, wherein said low elastic modulus resin layer is formed by selecting a resin material which has an elastic modulus of not higher than 200 kgf/mm$^2$.

5. The method as claimed in claim 4, wherein said low elastic modulus resin layer is formed by selecting a resin material which has an elastic modulus of not higher than 10 kgf/mm$^2$.

6. The method as claimed in claim 1, wherein scribe grooves are formed in said semiconductor chip and then said low elastic modulus resin layer is so formed as to fill said scribe grooves to cover walls of said scribe grooves, so that said semiconductor chip is cut along said scribe grooves whereby cutting sections of said semiconductor chips are covered with said low elastic modulus resin layer.

7. The method as claimed in claim 1, wherein said conductive pattern of said build-up type is formed to have a thickness of not less than 5 micrometers.

\* \* \* \* \*